United States Patent
Murali et al.

(10) Patent No.: US 8,785,294 B2
(45) Date of Patent: Jul. 22, 2014

(54) SILICON CARBIDE LAMINA

(75) Inventors: Venkatesan Murali, San Jose, CA (US); Steve Babayan, Los Altos, CA (US); Christopher J. Petti, Mountain View, CA (US)

(73) Assignee: GTAT Corporation, Merrimack, NH (US)

( * ) Notice: Subject to any disclaimer, the term of this patent is extended or adjusted under 35 U.S.C. 154(b) by 179 days.

(21) Appl. No.: 13/558,843

(22) Filed: Jul. 26, 2012

(65) Prior Publication Data

US 2014/0030836 A1    Jan. 30, 2014

(51) Int. Cl.
*H01L 21/30*    (2006.01)

(52) U.S. Cl.
USPC .......................................... 438/455; 438/479

(58) Field of Classification Search
USPC .................................. 438/479, 455
See application file for complete search history.

(56) References Cited

U.S. PATENT DOCUMENTS

| | | |
|---|---|---|
| 4,451,969 A | 6/1984 | Chaudhuri |
| 4,968,372 A | 11/1990 | Maass |
| 6,091,021 A | 7/2000 | Ruby et al. |
| 6,127,623 A | 10/2000 | Nakamura et al. |
| 6,486,008 B1 | 11/2002 | Lee |
| 6,518,596 B1 | 2/2003 | Basore |
| 6,534,382 B1 | 3/2003 | Sakaguchi et al. |
| 6,809,044 B1 | 10/2004 | Aspar et al. |
| 7,531,428 B2 | 5/2009 | Dupont |
| 7,842,585 B2 | 11/2010 | Sivaram et al. |
| 7,985,604 B2 | 7/2011 | Isaka et al. |
| 8,101,451 B1 | 1/2012 | Murali et al. |
| 8,173,452 B1 | 5/2012 | Petti et al. |
| 8,501,522 B2 * | 8/2013 | Herner et al. ............... 438/85 |
| 2002/0174959 A1 | 11/2002 | Yanagita et al. |
| 2003/0087479 A1 | 5/2003 | He et al. |
| 2005/0093100 A1 | 5/2005 | Chen et al. |
| 2006/0255340 A1 | 11/2006 | Manivannan et al. |
| 2007/0277874 A1 | 12/2007 | Dawson-Elli et al. |
| 2008/0179547 A1 | 7/2008 | Henley |

(Continued)

FOREIGN PATENT DOCUMENTS

| | | |
|---|---|---|
| EP | 1547146 B1 | 9/2011 |
| JP | 2003017723 A | 1/2003 |

(Continued)

OTHER PUBLICATIONS

"Fujitsu Develops Breakthrough Technology for Low-Cost Production of Gallium-Nitride HEMT", Fujitsu Global, Dec. 21, 2004, p. 1-4, www.fujitsu.com.

(Continued)

*Primary Examiner* — David Vu
(74) *Attorney, Agent, or Firm* — The Mueller Law Office, P.C.

(57) ABSTRACT

A method of fabricating an electronic device includes providing a silicon carbide or diamond-like carbon donor body and implanting ions into a first surface of the donor body to define a cleave plane. After implanting, an epitaxial layer is formed on the first surface, and a temporary carrier is coupled to the epitaxial layer. A lamina is cleaved from the donor body at the cleave plane, and the temporary carrier is removed from the lamina. In some embodiments a light emitting diode or a high electron mobility transistor is fabricated from the lamina and epitaxial layer.

18 Claims, 5 Drawing Sheets

(56) References Cited

U.S. PATENT DOCUMENTS

| | | |
|---|---|---|
| 2008/0265255 A1 | 10/2008 | Goyal |
| 2008/0296584 A1 | 12/2008 | Hachigo |
| 2009/0020592 A1 | 1/2009 | Lee et al. |
| 2009/0189126 A1 | 7/2009 | Prunchak |
| 2009/0194153 A1 | 8/2009 | Hilali et al. |
| 2009/0194162 A1 | 8/2009 | Sivaram et al. |
| 2009/0194164 A1 | 8/2009 | Sivaram et al. |
| 2009/0223562 A1 | 9/2009 | Niira et al. |
| 2009/0280597 A1 | 11/2009 | Wijekoon et al. |
| 2010/0129951 A1 | 5/2010 | Henley |
| 2010/0147448 A1 | 6/2010 | Agarwal et al. |
| 2010/0224911 A1 | 9/2010 | Okita et al. |
| 2010/0273329 A1 | 10/2010 | Prabhu et al. |
| 2010/0307572 A1 | 12/2010 | Bedell et al. |
| 2010/0307582 A1 | 12/2010 | Arai |
| 2010/0319765 A1 | 12/2010 | Choi |
| 2010/0326510 A1 | 12/2010 | Agarwal et al. |
| 2010/0330788 A1 | 12/2010 | Yu et al. |
| 2011/0171812 A1 | 7/2011 | Letertre et al. |
| 2011/0174376 A1 | 7/2011 | Lochtefeld et al. |
| 2011/0186910 A1 | 8/2011 | Forrest et al. |
| 2011/0221040 A1 | 9/2011 | Joshi et al. |
| 2011/0248265 A1 | 10/2011 | Forbes |
| 2011/0311789 A1 | 12/2011 | Loy et al. |
| 2012/0024377 A1 | 2/2012 | Takanashi et al. |
| 2012/0067423 A1 | 3/2012 | Lochtefeld et al. |
| 2012/0068345 A1 | 3/2012 | Schmidt et al. |
| 2012/0091474 A1 | 4/2012 | Or-Bach et al. |
| 2012/0094414 A1 | 4/2012 | Or-Bach et al. |
| 2012/0119224 A1 | 5/2012 | Tai et al. |
| 2012/0199845 A1 | 8/2012 | Werkhoven et al. |

FOREIGN PATENT DOCUMENTS

| | | | |
|---|---|---|---|
| KR | 20060024763 | A | 3/2006 |
| KR | 20060115990 | A | 11/2006 |
| KR | 20080109711 | A | 12/2008 |
| KR | 20100097537 | A | 9/2010 |
| KR | 102011003788 | | 1/2011 |
| KR | 20120006844 | A | 1/2012 |
| KR | 20120041165 | A | 4/2012 |
| KR | 20120050484 | A | 5/2012 |
| WO | 03003434 | A1 | 1/2003 |

OTHER PUBLICATIONS

Eddy et al., "Growth of gallium nitride thin films by electron cyclotron resonance microwave plasmaassisted molecular beam epitaxy", Journal of Applied Physics, Jan. 1993, vol. 73, No. 1, pp. 448-455.

Losurdo et al., "Plasmas for the Low-Temperature Growth of High-Quality GaN Films by Molecular Beam Epitaxy and Remote Plasma MOCVD", Phys. Stat. Sol. 2002, a, 190, No. 1, 43-51.

Mishra et al, "AlGaN/GaN HEMTs—An Overview of Device Operation and Applications", Proceedings of the IEEE, Jun. 6, 2002, vol. 90 No. 6, pp. 1022-1031.

Nguyen et al., "The fabrication of GaN-based light emitting diodes (LEDs)", Advances in Natural Sciences: Nanoscience and Nanotechnology, 2010, p. 1-5.

Shealy et al., "Optimization of Gallium Nitride High Power Technology for Commercial and Military Applications", IEEE BCTM 9.4, 2008, p. 146-153.

Sun and Han, "Heteroepitaxy of Nonpolar and Semipolar GaN", GaN and ZnO-based Materials and Devices, 2012, Springer-Verlag Berline Heidelberg, 1-25.

Vaughan, "Silicon Carbide Light Emitting Diode Fabrication and Characterization", NNIN REU Research Accomplishments, 2004, p. 144-145.

Examination Report dated Feb. 5, 2014 for European Patent Application No. 09152007.2.

International Search Report and Written Opinion dated Jan. 29, 2014 for PCT Application No. PCT/US2013/053316.

Office Action dated Feb. 12, 2014 for U.S. Appl. No. 13/366,338.

Office Action dated Jan. 15, 2014 for U.S. Appl. No. 13/558,836.

Office Action dated Jan. 8, 2014 for Chinese Patent Application No. 200910000496.1.

Notice of Allowance and Fees dated Jul. 30, 2013 for U.S. Appl. No. 12/750,635.

Office Action dated Aug. 1, 2013 for U.S. Appl. No. 13/494,687.

Office Action dated Aug. 13, 2013 for U.S. Appl. No. 13/366,338.

Office action dated Jul. 22, 2013 for U.S. Appl. No. 13/558,826.

Office action dated Jul. 22, 2013 for U.S. Appl. No. 13/558,836.

International Search Report and Written Opinion dated May 1, 2013 for PCT Application No. PCT/US2013/024682.

International Search Report and Written Opinion dated May 1, 2013 for PCT Application No. PCT/US2013/024683.

International Search Report and Written Opinion dated May 16, 2013 for PCT Application No. PCT/US2013/024681.

International Search Report and Written Opinion dated Nov. 27, 2013 for PCT Application No. PCT/US2013/051541.

Office Action dated Dec. 10, 2013 for U.S. Appl. No. 13/558,826.

International Search Report and Written Opinion dated Nov. 26, 2013 for PCT Patent Application No. PCT/US2013/054443.

International Search Report and Written Opinion dated Sep. 16, 2013 for PCT Application No. PCT/US2013/044622.

Office Action dated Nov. 18, 2013 for U.S. Appl. No. 13/494,687.

Office Action dated Nov. 8, 2013 for U.S. Appl. No. 13/689,628.

Official Letter and Search report dated Sep. 24, 2013 for Taiwanese application No. 98102109.

* cited by examiner

US 8,785,294 B2

SILICON CARBIDE LAMINA

BACKGROUND OF THE INVENTION

The use of semiconductor materials in electronics, photovoltaics, illumination and other applications has rapidly developed in recent decades, and continues to grow exponentially. Further growth of these industries is greatly dependent on the ability to develop cost-effective production of semiconductor materials. Epitaxy is one method of producing semiconductors, in which crystalline layers are deposited on a substrate. In homoepitaxy, the crystalline layer is grown on a substrate of the same material. In heteroepitaxy the crystalline film is grown on a different material, which allows for more readily-available materials to be used as substrates, and also allows for layers of different materials to be integrated together. Deposition of the layers typically occurs by vapor phase epitaxy, in which the crystal layers are deposited under chemical reaction, usually at relatively high temperatures. Although silicon has long been used as a semiconductor substrate, advancement of materials and technologies is requiring development of other choices for substrates. Selection of substrate materials depends on many factors, such as electrical properties, thermal properties, crystalline compatibility with the deposited layers, and cost.

One application of heteroepitaxy is in light emitting diodes (LEDs), such as LEDs formed from gallium nitride (GaN) grown over sapphire. Silicon carbide (SiC) and gallium arsenide (GaAs) are other substrates used in LEDs. GaN is capable of efficient light emission from deep ultraviolet to infrared wavelengths, and thus is a key material being developed for semiconductor-based white light sources. Choices for other materials in LED are based on factors such as cost, and compatibility with processing steps in the fabrication process.

Another application of heteroepitaxy is in transistor devices. Solid-state power devices—used in switching or amplifying large voltages and currents—are important components in communications, power delivery, and increasingly, transportation applications. One of the biggest innovations in this field in the last ten years has been the introduction of high electron mobility transistors (HEMTs) made on III-V semiconductors such as gallium nitride. HEMTs are devices that utilize a heterojunction between materials of differing bandgaps, where a two-dimensional electron gas (2DEG) is formed at the junction. The electrons have higher mobility at this heterojunction compared to moving through a doped region as in other semiconductor devices. HEMTs can be used at higher frequencies, control larger voltages in smaller areas, and dissipate (that is, waste) less power than similar transistors made with silicon. However, HEMTs face similar materials and processing challenges as LEDs.

Thus, there is an increasing need to produce heteroepitaxial materials with efficient cost and manufacturability.

SUMMARY OF THE INVENTION

A method of fabricating an electronic device includes providing a silicon carbide or diamond-like carbon donor body and implanting ions into a first surface of the donor body to define a cleave plane. After implanting, an epitaxial layer is formed on the first surface, and a temporary carrier is coupled to the epitaxial layer. A lamina is cleaved from the donor body at the cleave plane, and the temporary carrier is removed from the lamina. In some embodiments a light emitting diode or a high electron mobility transistor is fabricated from the lamina and epitaxial layer.

BRIEF DESCRIPTION OF THE DRAWINGS

Each of the aspects and embodiments of the invention described herein can be used alone or in combination with one another. The aspects and embodiments will now be described with reference to the attached drawings.

DETAILED DESCRIPTION OF THE EMBODIMENTS

Fabrication of electronic devices through heteroepitaxy typically involves depositing crystalline layers on a bulk wafer substrate, forming additional features such as electrical contacts and reflective coatings on the layers, and grinding down the back side of the wafer to the desired thickness. For example, gallium nitride LEDs are typically formed on thick silicon carbide wafers, such as on the order of 500 microns, and the SiC is ground down to a desired thinness. Thinning the wafer helps to reduce in-source inductance, and allows for low resistivity interconnects through the back side. Although SiC is less expensive than using bulk GaN, the loss of SiC material during grinding still results in a non-optimal use of the SiC. Sapphire is cheaper to use as an LED substrate than SiC, but sapphire still must be thinned due to its the poor thermal conductivity, and offers less lumens/area than SiC. Similarly, HEMT's usually have their substrate thinned before packaging, so that heat can be removed from the device more efficiently. This again results in wasted material and increased costs of the device. Thus, it is desirable to improve methods for heteroepitaxially-formed LEDs, HEMTs, and other electronic devices, such that the substrates are cost-effective and amenable to the manufacturing processes of these devices. The present invention utilizes silicon carbide and diamond-like carbon as substrates for heteroepitaxy, where the substrates are implanted with ions and exfoliated to produce lamina tailored to a desired thickness to be used in a final electronic device. Although the embodiments may be described in terms of silicon carbide substrates, it will be understood that diamond-like carbon may be interchanged with silicon carbide for the purposes of this disclosure.

Figure 1:
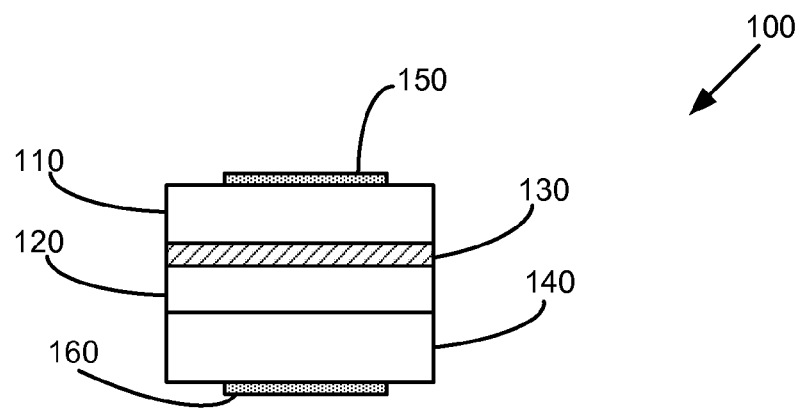
FIG. 1 is a cross-sectional schematic of a typical light emitting diode known in the art.

FIG. 1 is a schematic of a typical light emitting diode 100 known in the art. LED 100 includes a p-layer 110, an n-layer 120, an active region 130 between p-layer 110 and n-layer 120, a substrate 140, and electrical contacts 150 and 160. P-layer 110 and n-layer 120 are semiconductor materials—such as gallium nitride, gallium arsenide, indium phosphorus, or zinc selenide—doped with impurities to create the p- or n-type material. The type of material used is chosen according to the desired color of light, as each material has a specific band gap energy that determines the wavelength of light that is emitted. Active region 130, also known as a multiple quantum well layer (MQW), is a material with a lower bandgap than its surrounding materials, such as using InGaN for an MQW between GaN. Common materials for LED substrate 140 include silicon, germanium, gallium nitride and sapphire. When current is activated through electrical contacts 150 and 160, electrons and holes from p-layer 110 and n-layer 120 recombine in active region 130, and light is emitted. While GaN is a key material being developed for its light-emitting properties, substrate cost is a limiting factor of GaN-based device growth. Furthermore, epitaxial temperatures can affect the choices for possible materials and for the processing steps used in LED production.

Figure 2:
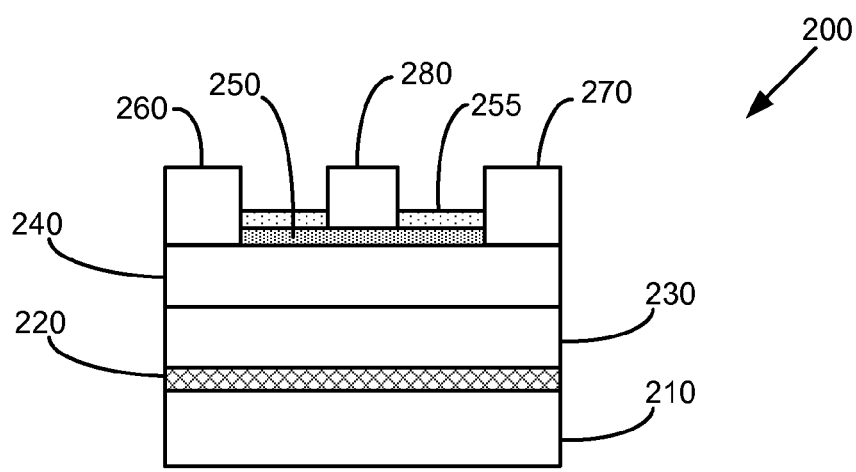
FIG. 2 shows a cross-sectional schematic of a high mobility electron transistor known in the art.

FIG. 2 shows a schematic of a typical high electron mobility transistor 200. HEMT 200 includes a substrate 210, a nucleation layer 220, a buffer layer 230, a barrier layer 240, a capping layer 250, a passivation layer 255, a source 260, a drain 270, and a gate 280. Substrate 210 may be, for example, GaN, sapphire, SiC, or silicon. Optionally, a nucleation layer 220 may be included to promote growth of the epitaxial layers. Material combinations for buffer layer 230 and barrier layer 240 include, for example, undoped GaN n-doped AlGaN, respectively, or undoped InGaAs and n-doped AlGaAs. Capping layer 250 may be, for example, n-doped GaN, with a SiN passivation layer 255. Manufacturing GaN-substrate HEMTs presents some of the same challenges found in GaN LEDs. One main challenge is that GaN is difficult and expensive to grow in bulk, so it is usually formed via heteroepitaxy on other substrates such as sapphire, SiC, or silicon. For HEMTs, sapphire is less desirable because of its poor thermal conductivity. Silicon carbide has excellent thermal conductivity, but it is expensive. Silicon is cheaper and compatible with standard very large scale integration (VLSI) manufacturing techniques, but it is not as thermally conductive as SiC.

In embodiments of the present invention, methods are described in which a silicon carbide or diamond-like carbon donor body is implanted with ions and epitaxial layers are deposited on the donor body. A carrier is contacted to the donor body, a free standing lamina is cleaved at the ion implantation plane, and the lamina with epitaxial layers is used to fabricate an electronic device. The methods advantageously utilize the property that silicon carbide exfoliates at temperatures higher than some epitaxial processes. The methods also utilize carriers that are compatible with the high temperatures required by exfoliation, and that may be easily removed without damaging the lamina. Thus, the present methods enable epitaxial layers to be produced on lamina with thicknesses tailored to a desired value, instead of requiring grinding to thin wafers to the necessary level. For the purposes of this disclosure, the term "carrier" shall be used interchangeably with "support element," "receiver" and "susceptor." The free standing lamina may be formed by, for example, the methods of Sivaram et al., U.S. patent application Ser. No. 12/026,530, "Method to Form a Photovoltaic Cell Comprising a Thin Lamina," filed Feb. 5, 2008, owned by the assignee of the present invention and hereby incorporated by reference. The free standing lamina of the present disclosure has a thickness tailored to be thin enough to eliminate grinding for the finished device. In addition, the same donor wafer may beneficially be reused to form multiple laminae, further reducing cost, and may be resold after exfoliation of multiple laminae for some other use.

Figure 3A:
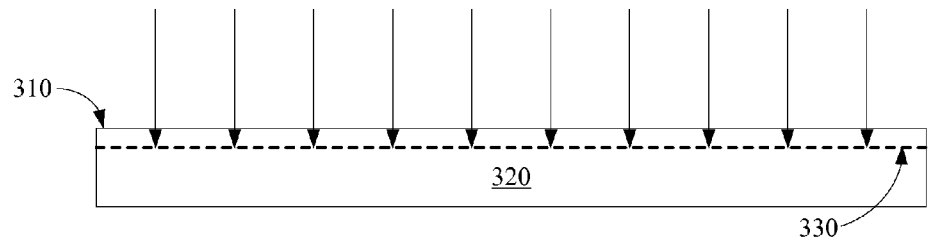
FIGS. 3A-3C illustrate cross-sectional views of a lamina formed by ion cleaving, as described in Sivaram, et al.
Figure 3B:
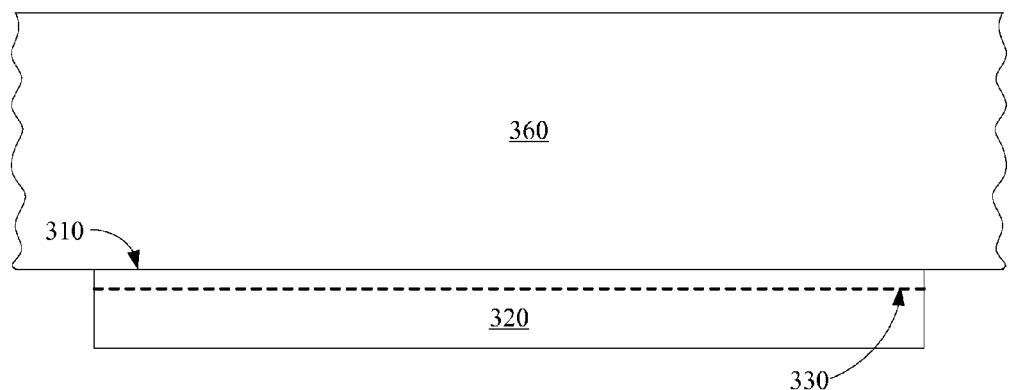
Figure 3C:
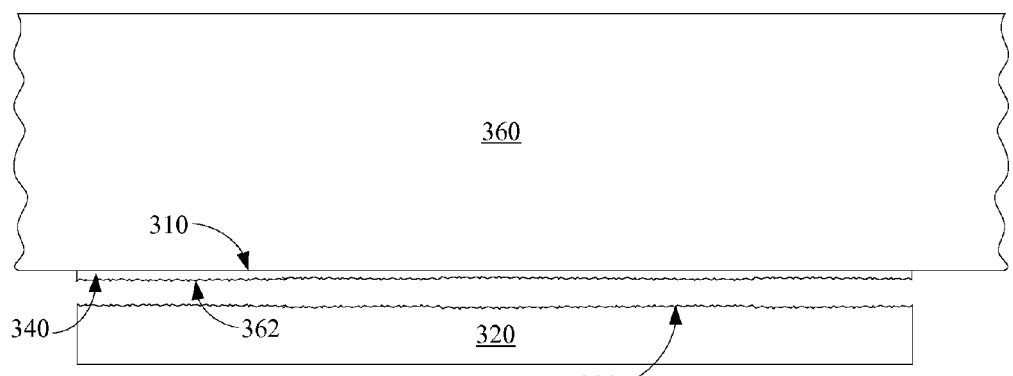

In Sivaram, the fabrication of a photovoltaic cell comprising a thin semiconductor lamina formed of non-deposited semiconductor material is described. Referring to FIG. 3A, in embodiments of Sivaram et al., a semiconductor donor body 320 is implanted through a first surface 310 with one or more species of gas ions, for example hydrogen and/or helium ions. The implanted ions define a cleave plane 330 within the semiconductor donor body 320. As shown in FIG. 3B, donor body 320 is affixed at first surface 310 to a receiver 360. Referring to FIG. 3C, an exfoliation step causes a lamina 340 to cleave from donor body 320 at cleave plane 330, creating a second surface 362. In embodiments of Sivaram et al., additional processing before and after the cleaving step forms a photovoltaic cell comprising semiconductor lamina 340, which is between about 0.2 and about 100 microns ($\mu$m) thick, for example between about 0.2 and about 50 $\mu$m thick, for example between about 1 and about 20 $\mu$m thick, in some embodiments between about 1 and about 10 $\mu$m thick or between about 4 and about 20 $\mu$m thick or between about 5 and about 15 $\mu$m thick, though any thickness within the named range is possible.

Figure 4:
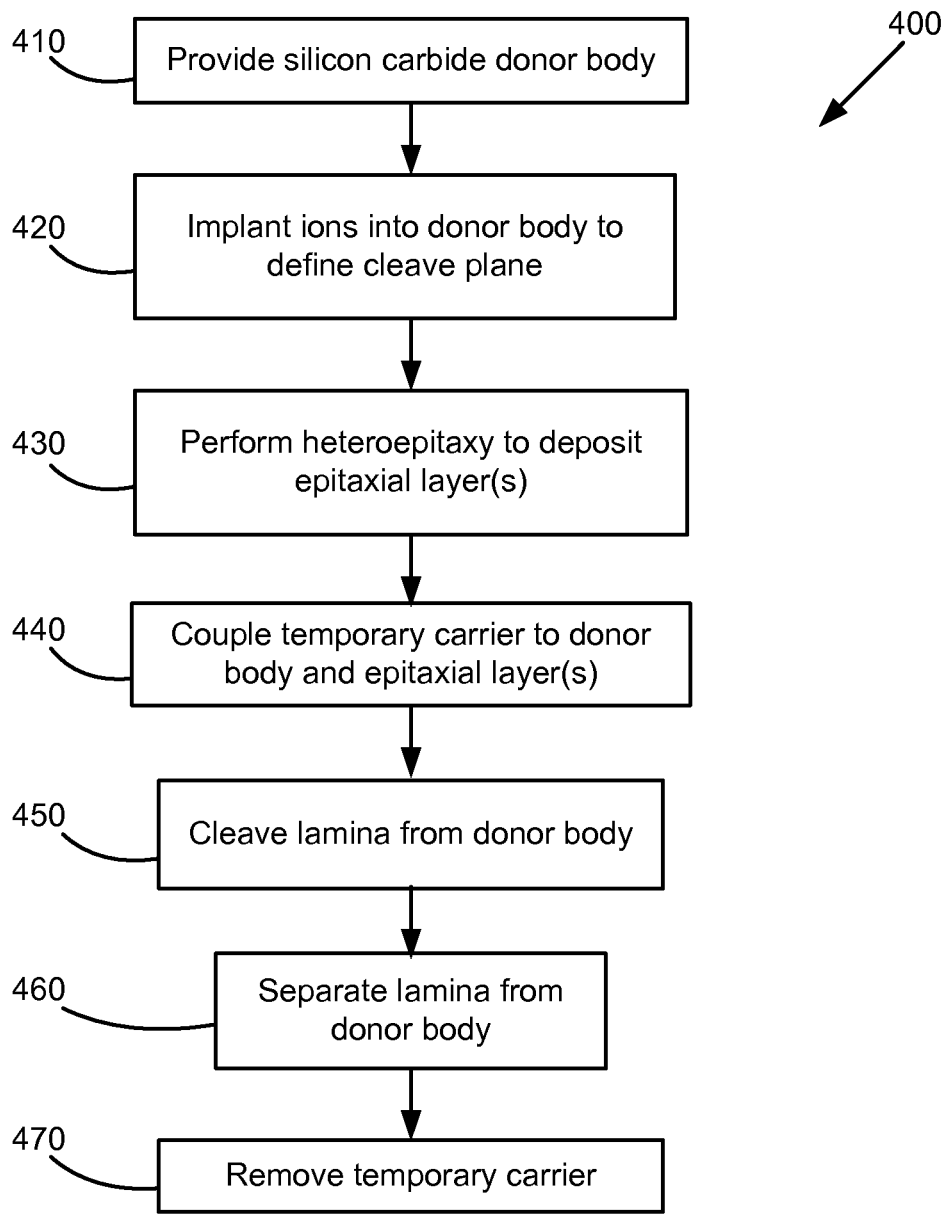
FIG. 4 is a flowchart of an exemplary method for performing heteroepitaxy in an exfoliation process.

FIG. 4 illustrates one embodiment of a method of the present disclosure, in which epitaxial layers are formed on a donor body, and a free standing lamina is cleaved from the donor body and used to form a light emitting diode. In flowchart 400 of FIG. 4, a donor body, such as silicon carbide or diamond-like carbon, is provided in step 410. In step 420, a top surface of the donor body is implanted with ions, such as hydrogen and/or helium, to define a cleave plane. This implant is performed using, for example, the implanter described in Parrill et al., U.S. patent application Ser. No. 12/122,108, "Ion Implanter for Photovoltaic Cell Fabrication," filed May 16, 2008; or those of Ryding et al., U.S. patent application Ser. No. 12/494,268, "Ion Implantation Apparatus and a Method for Fluid Cooling," filed Jun. 30, 2009; or of Purser et al. U.S. patent application Ser. No. 12/621,689, "Method and Apparatus for Modifying a Ribbon-Shaped Ion Beam," filed Nov. 19, 2009; all owned by the assignee of the present invention and hereby incorporated by reference, but any method may be used. Implant conditions are tailored to achieve the desired depth of the cleave plane, and therefor the thickness of the cleaved lamina. Implant conditions may also be adjusted to mitigate the appearance of physical defects (e.g., tears, cracks, rips, wave-front defects, radial striations, flaking or any combination thereof) in the lamina ultimately formed, as described in Kell et al., U.S. patent application Ser. No. 13/331,909, "Method and Apparatus for Forming a Thin Lamina" filed Dec. 20, 2011 owned by the assignee of the present invention and hereby incorporated by reference for all purposes. Physical defects include any defects that may cause reduced performance in completed cells. Implant conditions that may be adjusted to maximize the area that is substantially free of defects in the cleaved lamina include the temperature and/or the pressure applied to the donor body during implantation. In some embodiments the implant temperature for a SiC donor body may be maintained between 25 and 450° C., such on the order of 400° C. The implant temperature may be adjusted depending upon the material and orientation of the donor body. Other implantation conditions that may be adjusted include initial process parameters such as implant dose and the ratio of implanted ions (e.g., H:He ratio). For example, implant conditions for SiC may be between 300-500 keV beam energy, 30-50 mA current, and $7 \times 10^{16}$ to $9 \times 10^{16}$ atoms/cm$^2$ dosage. In some embodiments implant conditions may be optimized in combination with exfoliation conditions such as exfoliation temperature, exfoliation susceptor vacuum level, heating rate and/or exfoliation pressure in order to maximize the area that is substantially free of physical defects present in the lamina.

In step 430 of FIG. 4, heteroepitaxy is performed on the same surface as the implantation surface to deposit one or more layers for the desired device. Optionally, the implantation surface may be polished prior to implant. Performing heteroepitaxy after ion implantation beneficially avoids ion damage to the epitaxial layers. The process of flowchart 400 also takes advantage of the high exfoliation temperature of silicon carbide—that is, higher than 900° C.—which enables heteroepitaxy (that also occurs at high temperatures but below 900° C.) to occur without impacting exfoliation. The epitaxial layers may be materials such as, but not limited to, GaN, AlGaN, AlN, GaAs, InGaAs, AlGaAs, InGaAlAs, InP, GaP, InGaN, InSb, ZnSe, ZnS, or any combination of these. For example, an LED may have a 15-50 nm GaN buffer layer, a 1-3 µm n-GaN layer, with a multiple quantum well layer consisting of three pairs of InGaN/GaN layers (2-4 and 8-15 nm thick, respectively) and a 20-40 nm GaN cap layer, and a 200-300 nm p-GaN layer. Heteroepitaxy may be performed by methods known in the art. In one non-limiting example, GaN may be deposited by plasma-enhanced vapor phase epitaxy, which can be conducted at temperatures on the order of 800° C., or up to 900° C.

Still referring to FIG. 4, in step 440 a temporary carrier is coupled to the donor body, on the side on which the epitaxial layers have been deposited. Thus, the carrier is coupled to the epitaxial layers on the donor body, and to any other intervening layers that may have been added. Intervening layers may include, for example, metal electrodes, transparent conductors, and reflecting layers—including Ni, Au, Ti, Al or any combinations or alloys of these. The carrier may be non-bonded such as, for example, a susceptor assembly as described in Kell et al., U.S. patent application Ser. No. 13/331,915, "Method and Apparatus for Forming a Thin Lamina" filed Dec. 20, 2011 owned by the assignee of the present invention and hereby incorporated by reference for all purposes. The donor body may be separably contacted with a temporary carrier, without adhesive or permanent bonding, where the temporary carrier is a support element such as a susceptor assembly as described in Kell in order to stabilize the lamina during exfoliation. The separable contact between the carrier and donor body may utilize, for example, a vacuum force, an electrostatic force, or a temporary adhesive. In conventional methods, donor bodies or thin film silicon lamina in various stages of manufacture may be affixed to temporary carriers using adhesive or via chemical bonding. When adhesive is used, additional steps are required to initiate the debonding of the lamina and/or to clean the surface of the lamina and the temporary carrier after detachment. Alternatively, support elements may be dissolved or otherwise removed and rendered unusable for further support steps. Thus, bonded supports require additional manufacturing steps to remove the support element, and the support element is often for single use only. In contrast, the use of a non-bonded temporary support element advantageously decreases cost by reducing manufacturing steps. Additionally, a non-bonded temporary carrier facilitates processing on either side of the semiconductor lamina since the carrier may be easily detached from the lamina. The contact may be direct contact between the donor body and support element, such as by vacuum or electrostatic force, without adherents or bonding steps that require any chemical or physical steps to disrupt the contact beyond merely lifting the donor body or lamina from the susceptor. The susceptor may then be reused as a support element without further processing.

Following the contacting of the donor body to the temporary carrier, heat is applied to the donor body to exfoliate and cleave a lamina from the donor body at the cleave plane in step 450 of FIG. 4. Exfoliation conditions may be optimized to cleave the lamina from the donor body in order to minimize physical defects in a lamina exfoliated in the absence of an adhered support element, as described in Sivaram, and in Kell, U.S. patent application Ser. No. 13/331,909. Exfoliation parameters to be optimized may include, for example, pressure, thermal profile, and peak temperatures. In one example, exfoliation conditions for silicon carbide may include a temperature of 900-1000° C. for 10-20 minutes, such as 950° C. for 15 minutes. Exfoliation of SiC occurs at a temperature greater than 900° C., which is greater than epitaxial temperatures. Thus, premature exfoliation during preceding epitaxy steps is advantageously avoided. Separably contacting the lamina to a support element during the steps of exfoliation and damage anneal provides several significant advantages. The steps of exfoliation and anneal, if an annealing step is required, take place at relatively high temperature. In contrast, if a pre-formed support element is permanently affixed to the donor body, such as with adhesives or chemicals, as in conventional methods before these high-temperature steps, the permanent support element will necessarily be exposed to high temperatures along with the lamina, as will any intervening layers. Many materials cannot readily tolerate high temperature, and if the coefficients of thermal expansion of the support element and the lamina are mismatched, heating and cooling will cause strain that may damage the thin lamina. Thus, a non-bonded support element provides for an optimized surface for lamina manufacture independent of bonding and debonding protocols that would potentially inhibit the formation of a defect free lamina. Annealing may occur before or after the lamina is separated from the donor body.

In step 460 of FIG. 4, the exfoliated lamina may be removed from the donor body by any means, such as those as described in Kell, U.S. patent application Ser. No. 13/331,915. In some embodiments, the removal may utilize a deforming force on the lamina by a susceptor plate. In other embodiments the separable contact between the lamina and temporary support may be a vacuum force applied through a porous chuck plate to the donor body, where the vacuum force is able to remove the cleaved lamina from the donor body. After cleaving, the top surface of the donor body becomes a front surface of the lamina (e.g., surface 310 of FIG. 3C), while the cleaved surface becomes a back surface of the lamina (e.g., surface 362 of FIG. 3C). Although the susceptor is initially contacted to the front surface of the lamina during the cleaving process, the lamina may be transferred using one or more steps to other temporary carriers on either the front or back surface of the lamina, as desired. The lamina has a thickness measured from the front surface to the back surface. The thickness of the lamina is determined by the ion implantation depth, and may be between about 0.1 and about 50 µm thick, for example between about 3 and about 20 µm thick, though any thickness within the named ranges are possible. The thickness of the lamina is tailored to be the thickness that is required for a finished LED. The thickness may remain substantially unchanged during subsequent manufacturing steps, which advantageously removes the need for grinding or thinning of the wafer. For example, the thickness of the lamina layer in the finished device may stay within 20% deviation of the thickness of the initially cleaved lamina, for example within a 15% or 10% deviation.

In step 470, the carrier is removed from the epitaxial layer of the donor body. Step 470 may be optionally preceded or followed by contacting the lamina and epitaxial layer(s) to a second carrier using a de-bondable adhesive, electrostatic force, vacuum force, or other contacting method. Transferring the semiconductor device (that is, the lamina with epitaxial layers) to a carrier may enable processing of both sides of the device, such as on the back side of the lamina where there are no epitaxial layers. The carrier may be contacted on either the front or back surface of the lamina, through one or more transfers from the carrier of step 440. If using a de-bondable adhesive, the de-bondable adhesive may include mechanical or chemical bonding to bond or de-bond the lamina to the carrier. The de-bondable adhesives may require certain steps to initiate the de-bonding of the lamina and/or to clean the surface of the lamina and the temporary carrier after detachment. In other embodiments, the de-bondable adhesive may be a decomposable adhesive as described in Brainard et al., U.S. patent application Ser. No. 13/456,134, "Method of Forming a Permanently Supported Lamina," filed Apr. 25, 2012, which is owned by the assignee of the present invention and is hereby incorporated by reference for all purposes. In Brainard, the adhesive is decomposed by, for example, application of heat or ultraviolet light.

Figure 5A:
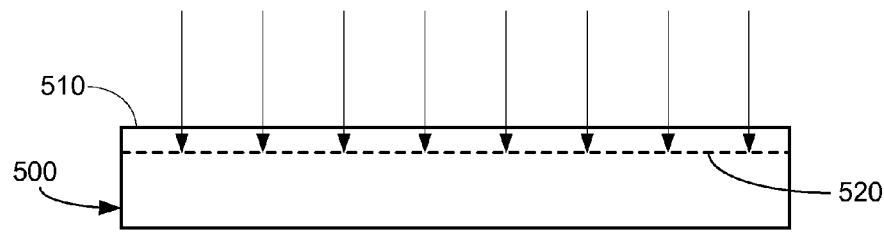
FIGS. 5A-5C depict cross-sectional views of stages of forming an LED according to some embodiments.
Figure 5B:
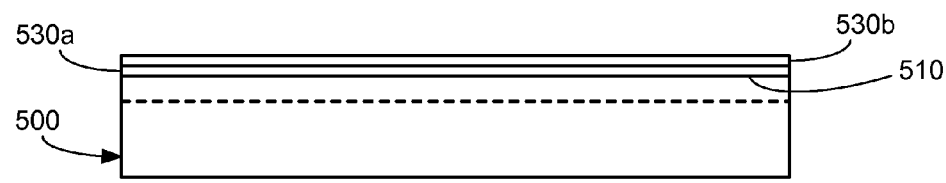
Figure 5C:
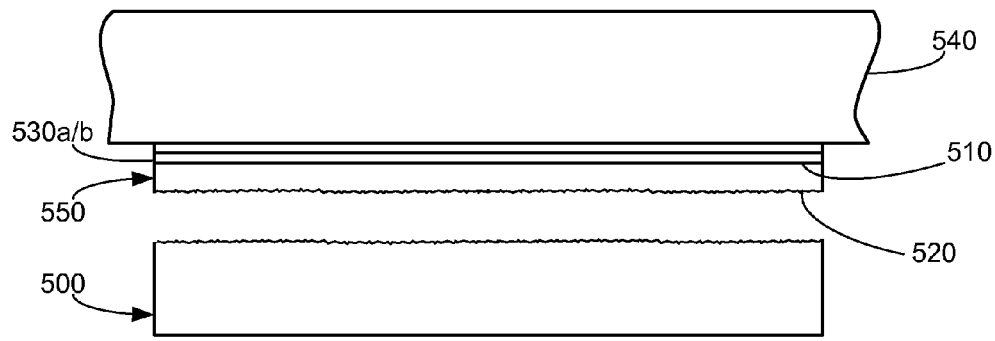

FIGS. 5A-5C illustrate an exemplary LED fabricated according to the method of FIG. 4. In FIG. 5A, a donor wafer 500 of silicon carbide is provided. Ions, such as hydrogen and helium, are implanted (as indicated by the arrows) through a first surface 510 of donor wafer 500 to form a cleave plane 520. The depth of cleave plane 520 from first surface 510 may be determined by the ion implantation conditions such as dose and temperature to produce a desired lamina thickness for the type of electronic device to be fabricated. For example, for an LED the depth of the cleave plane may be 3-20 microns. In FIG. 5B, epitaxial layers 530a and 530b are formed on the surface 510. As described above, formation of the epitaxial layers after ion implantation beneficially prevents ion damage to the epitaxial layers. Although two layers 530a and 530b are shown in the embodiment, only one layer (e.g. layer 530a) may be deposited, or more than two layers may be deposited. Epitaxial layers 530a and 530b may include LED materials known in the art such as, but not limited to, GaN, GaAs, InGaAs, AlGaAs, InGaAlAs, InP, GaP, InGaN, InSb, ZnSe and ZnS. In FIG. 5C a carrier 540, as described in relation to step 440 of FIG. 4 above, is coupled to donor body 500, layers 530a and 530b, and any additional layers (not shown). The donor body 500 is exfoliated at cleave plane 520, forming a lamina 550 having a thickness between first surface 510 and cleave plane 520. Exfoliation occurs above about 900° C., which allows heteroepitaxy to take places at relatively high temperatures; that is, up to 900° C. The carrier 540 allows separation of the lamina 550 from donor body 500, as well as transport and further processing of the lamina 550 and epitaxial layers 530a and 530b to fabricated a finished LED. Carrier 540 may be a separately contacted temporary support, such as described in relation to step 440 of FIG. 4. The thickness of lamina 550 remains substantially unchanged during fabrication of the LED device, such as within 20% of its initially cleaved thickness, thus reducing waste material of the SiC donor body 500 and consequently saving cost.

Figure 6:
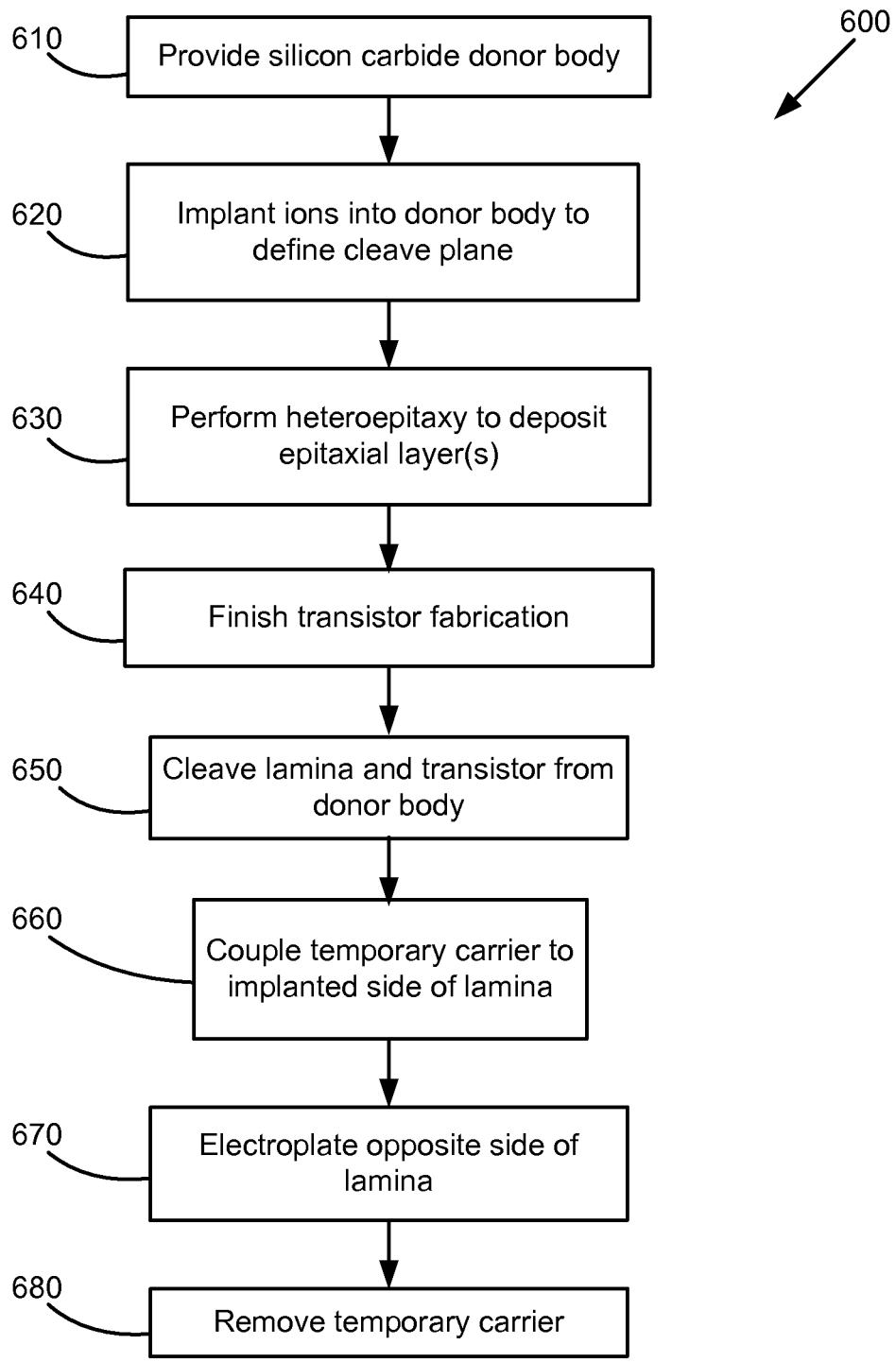
FIG. 6 is a flowchart of an exemplary method for forming an HEMT according to some embodiments.

FIG. 6 illustrates a flowchart 600 showing another embodiment of the present methods, in which a high electron mobility transistor is formed on exfoliated silicon carbide. The method begins with providing a silicon carbide donor body in step 610, to serve as the substrate for the transistor. Hydrogen and/or helium ions are implanted into a first surface of the donor body in step 620 to a desired depth, such as 3-20 microns. In step 630, the heteroepitaxial layers are grown. In one embodiment, the epitaxial layers include a buffer layer of GaN, followed by a barrier layer of AlGaN, followed by a capping layer of GaN. Optionally, a thin nucleation layer of AN may be grown on the SiC substrate, before the GaN buffer layer. The heteroepitaxy is performed at temperatures of 900° C. or less, which is beneficially less than exfoliation temperature of SiC. The GaN buffer layer may be, for example 0.5-2.0 µm thick, and the AlGaN and GaN layers may be a combined thickness of 10-30 nm. Other epitaxial layers include materials such as doped SiC or InGaP.

In step 640 of FIG. 6, additional processes are performed to complete the HEMT. These processes may include forming metallized source/drain contacts, annealing the contacts (such as 825° C. for a short time), depositing $Si_3N_4$ with plasma-enhanced chemical vapor deposition (PECVD), and isolating the contacts with a mesa etch or an $N^+$ ion implant. The gate of the HEMT is then formed by etching a pattern in the nitride and depositing metal into this pattern.

After the transistor components have been fabricated, in step 650 the semiconductor device, which includes the lamina and transistor components, may be coupled to a susceptor and is exfoliated at the cleave plane of the donor body. In various embodiments, as described in Kell, U.S. patent application Ser. No. 13/331,915, the temporary carrier is a plate of porous material, such as porous graphite, porous boron nitride, porous silicon, porous silicon carbide, laser-drilled silicon, laser-drilled silicon carbide, aluminum oxide, aluminum nitride, silicon nitride or any combination thereof. In such embodiments, a vacuum force applied to temporary carrier causes the lamina to be contacted to and held against the susceptor. Release of the vacuum force allows the lamina to be separably released from the susceptor.

Exfoliation of silicon carbide occurs at approximately 950° C. Because this temperature is higher than the epitaxial processes, premature exfoliation is beneficially avoided during heteroepitaxy. The resulting exfoliated lamina is coupled to a temporary carrier in step 660, to the face that was implanted with ions and on which the epitaxial layers are located. The temporary carrier in step 660 may be the susceptor that was used during step 650, or the susceptor may be replaced by a different component to be used as a temporary carrier during subsequent processing steps. In step 670, a seed layer deposition, for example by sputtering, is followed by applying a metal with a suitable coefficient of thermal expansion (CTE) to the opposite face of the lamina (for example, electroplating on the cleaved side of the lamina). For example, a nickel-iron alloy (NiFe, "Invar") would be able to match the CTE of GaN or other epitaxial layers (between 5 and 6 ppm/C). Because the final HEMT will operate at elevated temperatures, such as up to 150° C. for some applications, compared to other types of electronic devices such as LEDs CTE matching between materials is important. At this point, high temperature processing is finished, and the temporary carrier may be removed in step 680.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the spirit and scope of the present invention. Furthermore, those of ordinary skill in the art will appreciate that the foregoing description is by way of example only, and is not intended to limit the invention. Thus, it is intended that the present subject matter covers such modifications and variations.

What is claimed is:

1. A method of fabricating an electronic device, the method comprising the steps of:
   providing a donor body having a first surface, wherein the donor body comprises silicon carbide or diamond-like carbon;

implanting ions into the first surface of the donor body to define a cleave plane;

after the step of implanting, forming an epitaxial layer on the first surface of the donor body using heteroepitaxy;

coupling a temporary carrier to the epitaxial layer on the first surface of the donor body;

cleaving a lamina from the donor body at the cleave plane, wherein the cleave plane forms a back surface of the lamina, wherein the first surface of the donor body is a front surface of the lamina, and wherein the lamina has a cleaved thickness from the front surface to the back surface; and removing the temporary carrier from the lamina.

2. The method of claim 1 wherein the temporary carrier is coupled to the epitaxial layer using a vacuum force.

3. The method of claim 1 wherein the temporary carrier is coupled to the epitaxial layer using an electrostatic force.

4. The method of claim 1 wherein the temporary carrier is coupled to the epitaxial layer using an adhesive.

5. The method of claim 1 further comprising one or more intervening layers between the temporary carrier and the epitaxial layer.

6. The method of claim 5 wherein the intervening layers comprise at least one of the group consisting of metal electrodes, transparent conductors and reflecting layers.

7. The method of claim 1 wherein the epitaxial layer comprises at least one material chosen from the group consisting of GaN, doped SiC, GaAs, InGaAs, AlGaAs, InGaAlAs, InP, GaP, InGaN, InSb, ZnSe, ZnS, AlN and AlGaN.

8. The method of claim 1 wherein the step of cleaving occurs after the step of forming an epitaxial layer.

9. The method of claim 1 wherein the step of cleaving occurs at an exfoliation temperature, wherein the step of forming occurs at an epitaxial temperature, and wherein the exfoliation temperature is greater than the epitaxial temperature.

10. The method of claim 9 wherein the exfoliation temperature is at least 900 degrees Celsius.

11. The method of claim 9 wherein the epitaxial temperature is less than 900 degrees Celsius.

12. The method of claim 1 wherein the thickness of the lamina is between 3-20 microns.

13. The method of claim 1 further comprising the step of fabricating a light emitting diode with the lamina and epitaxial layer.

14. The method of claim 13 wherein the thickness of the lamina remains substantially the same between the steps of cleaving the lamina and fabricating the light emitting diode.

15. The method of claim 14 wherein the thickness of the lamina remains within 20% deviation of its cleaved thickness.

16. The method of claim 1 further comprising the step of fabricating a high electron mobility transistor with the lamina and epitaxial layer.

17. The method of claim 16 wherein the thickness of the lamina remains substantially the same between the steps of cleaving the lamina and fabricating the high electron mobility transistor.

18. The method of claim 17 wherein the thickness of the lamina remains within 20% deviation of its cleaved thickness.

* * * * *